United States Patent
Kronholz et al.

(10) Patent No.: US 8,884,379 B2
(45) Date of Patent: Nov. 11, 2014

(54) STRAIN ENGINEERING IN SEMICONDUCTOR DEVICES BY USING A PIEZOELECTRIC MATERIAL

(75) Inventors: Stephan Kronholz, Dresden (DE); Maciej Wiatr, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 498 days.

(21) Appl. No.: 12/711,322

(22) Filed: Feb. 24, 2010

(65) Prior Publication Data

US 2010/0219719 A1  Sep. 2, 2010

(30) Foreign Application Priority Data

Feb. 27, 2009  (DE) .................. 10 2009 010 843

(51) Int. Cl.
| | | |
|---|---|---|
| *H01L 27/088* | (2006.01) | |
| *H01L 29/78* | (2006.01) | |
| *H01L 27/12* | (2006.01) | |
| *H01L 27/20* | (2006.01) | |
| *H01L 21/8238* | (2006.01) | |
| *H01L 21/8234* | (2006.01) | |

(52) U.S. Cl.
CPC ..... *H01L 27/1203* (2013.01); *H01L 21/823807* (2013.01); *H01L 21/823412* (2013.01); *H01L 29/7849* (2013.01); *H01L 27/20* (2013.01)

USPC .......... 257/401; 257/192; 257/254; 257/255; 257/369; 257/E27.006

(58) Field of Classification Search
CPC ............... H01L 21/823412; H01L 21/823807; H01L 27/1203; H01L 27/20; H01L 29/7849; H01L 41/04; H01L 41/08
USPC .......... 257/254, 255, 369, 401, E27.006, 192
See application file for complete search history.

(56) References Cited

U.S. PATENT DOCUMENTS

| | | | | |
|---|---|---|---|---|
| 7,230,435 B2 * | 6/2007 | Kunikiyo et al. | ............. | 324/658 |
| 7,453,108 B2 * | 11/2008 | Jin | ................... | 257/288 |
| 7,586,158 B2 * | 9/2009 | Hierlemann et al. | ......... | 257/369 |
| 2006/0278903 A1 | 12/2006 | Ishimaru | ....................... | 257/288 |

OTHER PUBLICATIONS

Translation of Official Communication from German Patent Office for German Patent Application No. 10 2009 010 843.2 dated Nov. 10, 2009.

* cited by examiner

*Primary Examiner* — Jay C Kim
(74) *Attorney, Agent, or Firm* — Amerson Law Firm, PLLC

(57) ABSTRACT

An efficient strain-inducing mechanism may be provided on the basis of a piezoelectric material so that performance of different transistor types may be enhanced by applying a single concept. For example, a piezoelectric material may be provided below the active region of different transistor types and may be appropriately connected to a voltage source so as to obtain a desired type of strain.

17 Claims, 5 Drawing Sheets

STRAIN ENGINEERING IN SEMICONDUCTOR DEVICES BY USING A PIEZOELECTRIC MATERIAL

BACKGROUND OF THE INVENTION

1. Field of the Invention

Generally, the present disclosure relates to the field of integrated circuits, and, more particularly, to the manufacture of circuit elements, such as transistors, having strained semiconductor regions, such as channel regions, by using stress-inducing sources, such as globally strained silicon substrates and the like, to enhance charge carrier mobility in the strained semiconductor regions.

2. Description of the Related Art

Generally, a plurality of process technologies are currently practiced to fabricate integrated circuits, wherein, for complex circuitry, such as microprocessors, storage chips and the like, CMOS technology is presently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness of the gate dielectric may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has, therefore, been proposed to also enhance the channel conductivity of the transistor elements by increasing the charge carrier mobility in the channel region for a given channel length, thereby offering the potential for achieving a performance improvement that is comparable with the advance to technology nodes using reduced gate lengths while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In some approaches, a stress component created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may contribute significantly to the overall production costs. Moreover, the amount of stress-inducing material and in particular the intrinsic stress thereof may not be arbitrarily increased without requiring significant design alterations. For example, the degree of tensile stress in corresponding portions of the dielectric layer formed above an N-channel transistor may presently be limited to approximately 1.5 GPa (Giga Pascale), while the amount of tensile stressed material may have to be reduced in sophisticated transistor geometries including reduced distances of neighboring transistor elements in device areas of high packing density, and thus new developments of respective deposition techniques may be required for further improving performance of N-channel transistors on the basis of stressed overlayers. On the other hand, significantly higher compressive stress levels may be provided for P-channel transistors by presently established techniques, thereby creating an imbalance with respect to enhancing performance of NMOS and PMOS transistors.

In still a further approach, a substantially amorphized region may be formed adjacent to the gate electrode at an intermediate manufacturing stage, which may then be re-crystallized in the presence of a rigid layer formed above the transistor area. During the anneal process for re-crystallizing the lattice, the growth of the crystal will occur under stress conditions created by the overlayer and result in a tensile strained crystal. After the re-crystallization, the sacrificial stress layer may be removed, wherein, nevertheless, a certain amount of strain may be "conserved" in the re-grown lattice portion. This effect is generally known as stress memorization. Although this mechanism provides a promising technique for enhancing performance of N-channel transistors, a highly controlled application thereof is difficult as the exact mechanism is not yet understood.

In other approaches, a strain-inducing semiconductor alloy may be provided within drain and source regions, which may exert a specified type of stress on the channel region to thereby induce a desired type of strain therein. For example, a silicon/germanium alloy may frequently be used for this purpose in order to obtain a compressive stress component in the adjacent channel region of, for instance, P-channel transistors in order to increase mobility of holes in the corresponding P-channel. In sophisticated applications, two or more of the above-specified strain-inducing mechanisms may be combined to further enhance the overall strain obtained in the corresponding channel regions. These strain-inducing mechanisms may be considered as "local" mechanisms, since the strain may be induced in and above the corresponding active region for the transistor element under consideration, wherein the finally obtained strain component in the channel region may significantly depend on the overall device dimensions. That is, typically, these local strain-inducing mechanisms may rely on the stress transfer capabilities via other device components, such as gate electrodes, spacer elements formed on sidewalls of the gate electrodes, the lateral dimensions of the drain and source regions and the like. Consequently, the magnitude of the strain in the channel region may significantly depend on the technology under consideration, since, typically, reduced device dimensions may result in an over-proportional reduction of the corresponding strain-inducing mechanism. For example, creating strain by a dielectric overlayer, such as a contact etch stop layer, may frequently be used, wherein, however, the amount of internal stress of the corresponding dielectric material may be restricted by deposition-related constraints, while at the same time, upon reducing device dimensions, for instance the spacing between two neighboring transistor elements, may require a significant reduction of the layer thickness, which may thus result in a reduction of the finally obtained strain component. For these reasons, typically, the magnitude of the strain in the channel region provided by the local strain-inducing mechanisms may be several hundred MPa, while a further increase of this value may be difficult to be achieved upon further device scaling.

For these reasons, attention is increasingly drawn to other mechanisms in which a moderately high degree of strain may be created in a global manner, i.e., on wafer level, so that the corresponding active regions of the transistor elements may be formed in a globally strained semiconductor material, thereby providing a "direct" strain component in the corresponding channel regions. For instance, a silicon material may be epitaxially grown on an appropriately designed "buffer layer" in order to obtain a strained silicon layer. For example, a silicon/germanium buffer layer, which may be provided with its substantially natural lattice constant, may be used for forming thereon a strained silicon layer, which may have a moderately high tensile biaxial strain of 1 GPa or higher, depending on the lattice mismatch between the buffer layer and the strained silicon layer.

Consequently, the approach of applying a global strain-inducing layer across the entire substrate may enable a highly efficient strain-inducing mechanism for one type of transistor while possibly negatively affecting performance of the other type of transistor. Consequently, when combining the advantages of a global strain-inducing material with strain engineering techniques allowing a local adaptation of the strain conditions in a certain type of transistor, a significant degree of process complexity may also be involved since, for instance, the strain-inducing effect of the global strain layer may have to be locally relaxed or over-compensated for by specifically designed local strain techniques. As a consequence, although the direct generation of strain in the channel region of sophisticated transistor elements may provide a significant gain in performance, it is extremely difficult to appropriately "pattern" the global strain-inducing layer, such as a silicon/germanium layer, in order to provide desired strain conditions in a local manner. Due to the ongoing shrinkage of feature sizes, however, there is an ongoing demand for enhancing the strain-inducing efficiency since a corresponding high strain component in silicon-based semiconductor materials may significantly extend the applicability of well-established process techniques and materials that may typically be used in volume production techniques on the basis of silicon. Hence, it is highly desirable to take advantage of strain engineering techniques without unduly contributing to the overall complexity of the manufacturing techniques typically used in volume production of sophisticated semiconductor devices.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and devices for enhancing strain engineering techniques during the fabrication of sophisticated semiconductor devices by using a piezoelectric material that may be mechanically coupled to a semiconductor region of interest so as to induce a desired type of strain therein. Piezoelectric materials are typically crystalline materials or ceramic materials having a very low conductivity and may thus be considered as insulating materials. Furthermore, upon creating an electric field within the piezoelectric material, a substantial mechanical displacement, i.e., a contraction or expansion, may be induced, which may, therefore, be efficiently used as a strain-inducing mechanism by transferring the strain into the mechanically coupled semiconductor region. Consequently, depending on the orientation of the electric field, i.e., by inverting the corresponding voltages applied to the piezoelectric material, different types of strain may be induced on the basis of a single material, thereby significantly reducing the overall complexity of manufacturing strategies in which different magnitudes and types of strain may be required for adjusting the overall performance of a semiconductor device. For example, by providing an appropriate contact regime and appropriately aligning the piezoelectric material with respect to any current flow directions of transistor elements or any other semiconductor-based circuit elements, different types of strain, and also different magnitudes, may be obtained without requiring complex material systems, such as silicon/germanium alloys in combination with silicon/carbon alloys, when a concurrent enhancement of the performance of N-channel transistors and P-channel transistors is required. Furthermore, the piezoelectric material may be provided in a global manner, for instance in the form of an appropriately prepared substrate material for the fabrication of semiconductor devices, wherein a local adaptation of the strain characteristics may be efficiently achieved on the basis of providing an appropriate contact regime for establishing a desired electric field in a highly local manner. For example, the active regions of individual transistor elements receive an appropriate contact regime so as to allow individual adjustment of the magnitude and/or type of strain induced by the piezoelectric material, while, on the other hand, device areas may receive strain conditions on a more global scale, for instance by commonly controlling the strain conditions for a plurality of active regions or generally for a plurality of circuit elements, if appropriate.

One illustrative semiconductor device disclosed herein comprises a semiconductor region formed above a substrate. Furthermore, a contact structure connects to the semiconductor region to define the direction of current flow through the semiconductor region. Additionally, the semiconductor device comprises a piezoelectric region formed above the substrate so as to be mechanically coupled to the semiconductor region. A first contact is provided and connects to a first contact portion of the piezoelectric region. Furthermore, a second contact is provided to connect to a second contact portion of the piezoelectric region, wherein the first and second contact portions of the piezoelectric region are positioned so as to define an electric field direction in the piezoelectric region that is aligned to the direction of current flow through the semiconductor region.

One illustrative substrate for forming semiconductor devices disclosed herein comprises a carrier material and a buried insulating material formed on the carrier material, wherein the buried insulating material comprises a piezoelectric material layer. Moreover, the substrate comprises a crystalline semiconductor layer formed on the buried insulating material.

One illustrative method disclosed herein relates to generating strain in a semiconductor device. The method comprises providing a piezoelectric region so as to be mechanically coupled to an active region of a semiconductor circuit element. The method further comprises generating an electric field in the piezoelectric region so as to be aligned with a current flow direction in the active region, wherein the electric field induces one of a compressive strain and a tensile strain in the active region along the current flow direction. Finally, a current flow is established in the active region.

BRIEF DESCRIPTION OF THE DRAWINGS

The disclosure may be understood by reference to the following description taken in conjunction with the accompanying drawings, in which like reference numerals identify like elements, and in which.

Figure 1A:
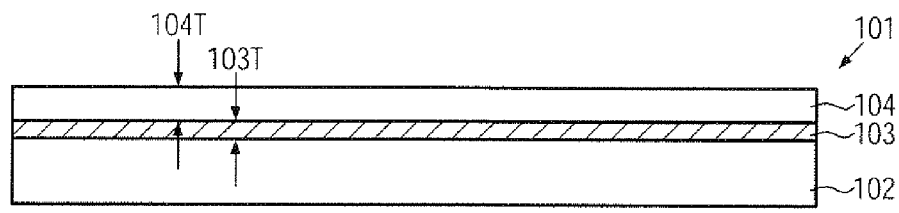
FIGS. 1*a*-1*c* schematically illustrate cross-sectional views of a substrate for forming semiconductor devices, wherein the substrate comprises a buried insulating material including a piezoelectric material, according to various illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides substrates, semiconductor devices and methods of operating the same in which strain engineering techniques of enhanced flexibility may be applied on the basis of a globally provided strain-inducing material. For this purpose, a piezoelectric material may be formed so as to be mechanically coupled to semiconductor regions, in which at least portions of circuit elements, such as transistors and the like, are to be formed. As is well known, the piezoelectric effect is a phenomenon in which specific dipole regions of the material may align to an applied electric field, wherein, however, the alignment of the dipole regions may result in a significant mechanical deformation, such as contraction or expansion along the electric field as long as a certain critical electric field is not exceeded. Piezoelectric materials are frequently crystalline materials or ceramic materials having a very low electrical conductivity so that these materials may provide sufficient insulating abilities, even if they are in direct contact with conductive regions, such as semiconductor regions and the like. For example, typical materials are quartz, rochelle salt, tourmaline, lithium niobate and the like. According to the principles disclosed herein, an appropriate piezoelectric material may be brought into close proximity to a semiconductor region of interest, such as a channel region of a field effect transistor and the like, wherein also the orientation of the piezoelectric material in combination with an electric field that may be established therein at any appropriate point in time may be aligned to a current flow direction in the semiconductor region of interest. Consequently, upon establishing an electric field of appropriate strength and orientation, for instance along or oppositely to the current flow direction, the resulting mechanical deformation may be transferred into the semiconductor region and may also result in a corresponding strain therein. Consequently, controllable strain conditions may be induced in the semiconductor material by appropriately selecting the strength and orientation of the electric field, thereby providing the possibility of adjusting the drive current capabilities of sophisticated transistor elements in a static and/or dynamic manner, depending on the overall requirements. That is, by providing an appropriate contact regime for connecting to the piezoelectric material, the strain conditions may be adjusted in a local manner, while also allowing readjustment of the strain conditions during operation of the device according to a specific control regime. For example, by increasing the corresponding electric field in the piezoelectric material, the performance of a specific circuit element may be increased or reduced, depending on the orientation of the corresponding strain component, which may be advantageous in appropriately adjusting the overall performance of specific circuit elements or circuit portions of sophisticated semiconductor devices. For example, performance of P-channel transistors and N-channel transistors may be concurrently increased by locally providing an appropriate electric field in respective portions of the piezoelectric material, without requiring complex and complicated manufacturing strategies that are typically involved for providing different strain conditions on the basis of different strain-inducing materials, such as embedded semiconductor alloys, strain-inducing overlayers and the like. In other cases, performance of the semiconductor device may be adjusted in accordance with certain requirements, for instance with respect to compensating for a natural aging of circuit elements and thus a natural decrease of performance over lifetime of the semiconductor device, while, in other cases, performance of circuit elements or entire device areas may be adjusted according to any appropriate control regime.

In some illustrative embodiments disclosed herein, the electric fields in the piezoelectric materials may be established on the basis of a contact regime, in which device internal contacts may be used, such as drain or source terminals and the like, thereby reducing the complexity of a contact structure for connecting to the piezoelectric material. In some illustrative embodiments, the strain-inducing effect may, therefore, be established in a highly dynamic manner, i.e., only at time intervals in which an appropriate voltage drop may be present across the transistor elements, thereby enhancing performance thereof in a highly dynamic manner, i.e., at corresponding state transitions, while providing a reduced overall channel conductivity when the transistor is in a non-conductive state, thereby reducing parasitic leakage currents.

In some illustrative embodiments, the piezoelectric material may be incorporated in the form of a "buried insulating material" so that a strong coupling to corresponding active regions may be accomplished, while at the same time providing a high degree of compatibility with conventional process strategies. For example, the piezoelectric material may be provided within or on a conventional buried insulating material, such as a silicon dioxide material and the like, while, in other cases, the buried insulating material of conventional SOI substrates may be replaced by the piezoelectric material, which may also provide sufficient insulating capabilities. Consequently, the piezoelectric material may be efficiently contacted on the basis of appropriate contact elements which may, for instance, extend to the piezoelectric material within isolation structures in order to enable an individual supply of a voltage to the piezoelectric material without interfering with any supply voltages used in the active regions enclosed by the isolation structure. In other cases, any other contact technology, as may frequently be used for forming substrate contacts in SOI architectures, connecting to buried circuit elements, such as substrate diodes and the like, may also be efficiently used in order to connect to the piezoelectric material. In still other illustrative embodiments, the piezoelectric material in the form of a portion of the buried insulating material may be contacted through the overlying active semiconductor region, thereby reducing overall device and process complexity.

It should be appreciated that the principles disclosed herein are highly advantageous in the context of forming semiconductor devices including circuit elements, such as field effect transistors, bipolar transistors and the like, having components with a critical dimension of approximately 50 nm and less, since, in this case, further enhanced strain engineering techniques may be required for obtaining a certain specified degree of device performance. For example, performance of N-channel transistors and P-channel transistors may be enhanced on the basis of a single material and a corresponding process flow that may be concurrently applied to both types of transistors. On the other hand, the principles disclosed herein may also be efficiently combined with additional strain-inducing techniques, as are previously discussed, for instance in the form of stress memorization techniques, embedded semiconductor alloys, stress-inducing dielectric materials that may be formed above the basic transistor configuration and the like. Moreover, the principles disclosed herein may also be used in combination with semiconductor devices that are fabricated on the basis of less sophisticated manufacturing techniques, i.e., involving critical dimensions above 50 nm, since, also in this case, a significant reduction of overall process complexity may be accomplished if a corresponding strain engineering may be required. Furthermore, as discussed above, the controllable adjustment of strain conditions may also provide enhanced controllability of performance of semiconductor devices, for instance in a highly dynamic manner, which may be advantageous for many types of semiconductor devices without being restricted to specific technologies and device architectures. Consequently, unless explicitly set forth in the specification or the appended claims, the devices, substrates and methods disclosed herein should not be considered as being restricted to specific critical dimensions or device architectures.

FIG. 1a schematically illustrates a cross-sectional view of a substrate 101, which may represent a substrate for forming therein and thereabove semiconductor devices including circuit elements, such as transistors, resistors, capacitors and the like, as are typically required for complex integrated circuits. The substrate 101 may thus have any appropriate size and shape so as to comply with the requirement for being processed in a semiconductor facility. That is, typically, the substrate 101 may be provided in the form of a wafer having an appropriate diameter, such as 100 mm, 200 mm, 300 mm, 450 mm and the like, depending on the corresponding industrial standards. The substrate 101 may comprise a carrier material 102 which may represent any appropriate material for imparting a sufficient mechanical stability to the substrate 101 and to comply with specific standards for being handled and processed in a semiconductor facility. In some illustrative embodiments, the carrier material 102 may comprise a crystalline semiconductor material, such as a silicon material, in which other components, such as dopant species and the like, may be incorporated. Furthermore, the substrate 101 may comprise a piezoelectric material layer 103, such as one of the above-specified materials, which may result in a specific degree of mechanical deformation upon application of a specified electric field. In some illustrative embodiments, the piezoelectric material layer 103 may be formed on a crystalline semiconductor material of the carrier material 102, for instance on a silicon material, thereby, as previously indicated, providing a moderately high degree of electrical insulation in the vertical direction. A thickness 103T may be selected so as to comply with specific requirements of the semiconductor devices to be formed in and above the substrate 101. For example, the thickness 103T may be selected to be approximately 1 μm and less so as to provide a high degree of compatibility with semiconductor wafers corresponding to an SOI (silicon-on-insulator) architecture for sophisticated and complex integrated circuits, which may require a moderately thin "active" semiconductor layer 104 formed above a buried insulating material. For example, generally, the thickness and the dielectric characteristics of a buried insulating material may have influence on the operational behavior of transistor elements formed in the semiconductor layer 104 and hence the thickness 103T may be appropriately adapted in view of the material characteristics of the piezoelectric material and performance characteristics of circuit elements to be formed in and above the layer 104. It should be appreciated that a value of greater than 1 μm may be used, if considered appropriate for a specific application. Similarly, the semiconductor layer 104, such as a silicon-based layer, a silicon/germanium layer and the like, may have any appropriate thickness 104T as required for the semiconductor devices under consideration. For example, in sophisticated applications, the thickness 104T may be approximately 1 μm and less, wherein, in highly advanced SOI transistors based on silicon, the thickness 104T may be in the range of 100 nm and significantly less. In the embodiment shown in FIG. 1a, the semiconductor layer 104 may be formed on the piezoelectric material layer 103, that is, the layer 104 may be in direct contact with the piezoelectric material 103. Hence, in this case, a high degree of mechanical coupling between the material 103 and the layer 104 may be achieved.

Figure 1B:
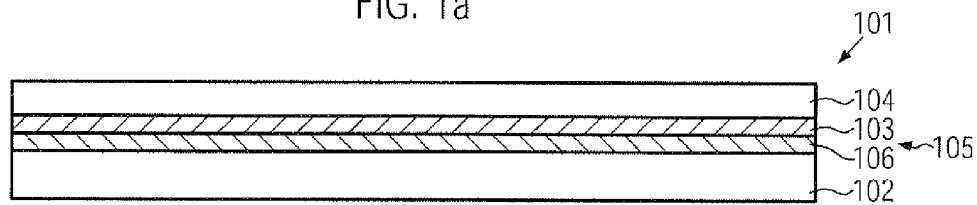

FIG. 1b schematically illustrates the substrate 101 according to further illustrative embodiments in which a buried insulating material layer 105 may be provided in which, in addition to the piezoelectric material 103, a further insulating material 106 may be provided. For example, the material 106 may represent a conventional buried insulating material, such as silicon dioxide, silicon nitride and the like. In the embodiment shown, the piezoelectric material 103 may still be in direct contact with the semiconductor layer 104, while the layer 106 may be positioned between the layer 103 and the carrier material 102.

Figure 1C:
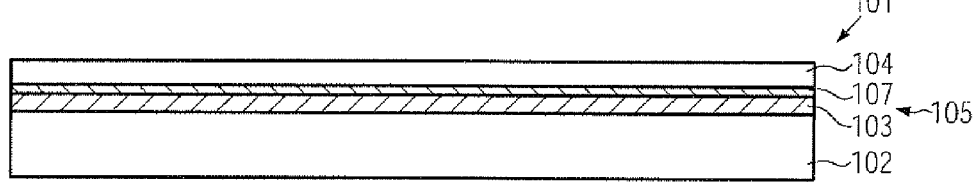

FIG. 1c schematically illustrates further illustrative embodiments of the substrate 101 in which a buried insulating layer 105 may comprise, in addition to or alternatively to the layer 106 (FIG. 1b), an additional "conventional" insulating material layer 107 which may separate the piezoelectric material 103 from the semiconductor layer 104, if a high degree of compatibility with conventional process techniques and devices may be desired.

The substrate 101 as shown in any of FIGS. 1a-1c may be formed on the basis of the following techniques. In some illustrative embodiments, the carrier material 102 may be provided in the form of a separate substrate and may be coated with the buried insulating layer 105, which may comprise the piezoelectric material layer 103, while, in other cases, the piezoelectric material layer 103 may be directly formed on the carrier material 102. For example, a dielectric material may be formed first and subsequently the material 103 may be formed thereon, for instance by deposition and surface treatment, by connecting a crystalline piezoelectric material and cleaving the same and the like, thereby obtaining a configuration as shown in FIG. 1b. If required, an additional dielectric material may be formed when a direct contact of the material 103 with the semiconductor layer 104 is considered inappropriate. In other cases, the material 103 may be formed first followed by the deposition of the material 107 as illustrated in FIG. 1c. Thereafter, a further carrier material having formed thereon an appropriate semiconductor material may be bonded to the buried insulating layer 105 or the layer 103 by applying heat and pressure, thereby forming a composite substrate. Thereafter, one of the carrier materials may be removed, for instance by cleaving, polishing and the like, so as to obtain the semiconductor layer 104 having a desired thickness.

Figure 1D:
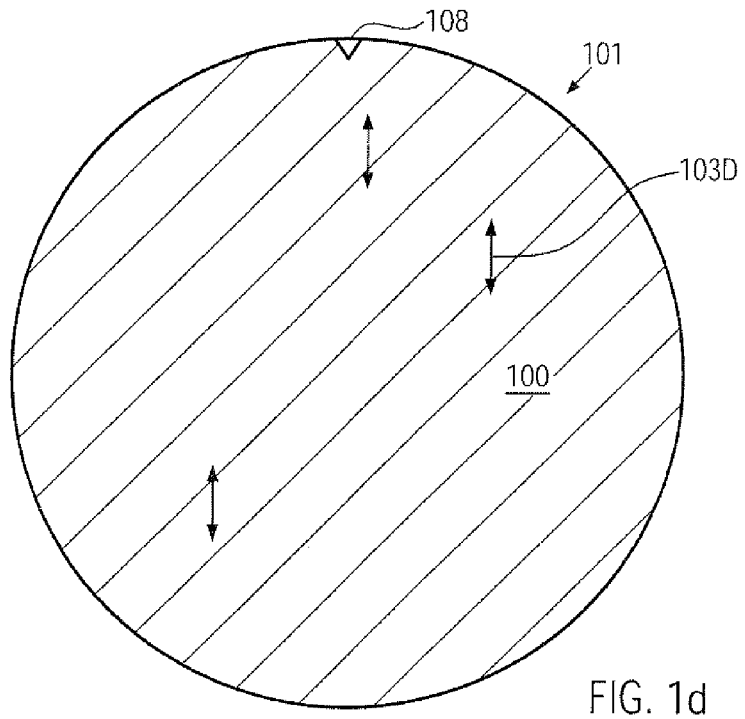
FIG. 1*d* schematically illustrates a top view of a substrate including a piezoelectric material having an orientation that is aligned with respect to a current flow direction of circuit elements to be formed on the basis of the substrate, according to illustrative embodiments.

FIG. 1d schematically illustrates a top view of the substrate 101 in which a notch 108 may be provided and which may be used for appropriately orienting the substrate 101 during the processing in a semiconductor facility. As is well known, the semiconductor material 104, possibly in combination with a crystalline material provided in the carrier material 102, may be provided in a well-defined manner with respect to the crystallographic configuration thereof. For example, frequently, a surface orientation (100) may be used for silicon-based semiconductor layers, wherein a <110> crystallographic axis may be oriented along a direction as indicated by the notch 108. For example, field effect transistors may frequently be oriented such that a channel length direction is aligned to the <110> direction, in which case a compressive strain component along the current flow direction may result in an increased hole mobility, while a tensile strain component may increase the mobility of electrons. Consequently, in some illustrative embodiments, the piezoelectric material layer 103 may be formed such that an orientation of the dipole regions may be aligned with respect to a current flow direction of transistor elements or other circuit elements to be formed in and above the semiconductor layer 104, which for convenience is not illustrated in FIG. 1d. Thus, as indicated by the arrows 103D, the piezoelectric material 103 may be oriented with respect to the <110> crystallographic axis or any physically equivalent axis thereof so that establishing an electric field in this direction may result in a corresponding contraction or expansion, as previously explained. It should be appreciated, however, that, for a given crystallographic orientation of the substrate 101, any other current flow direction may be selected during the processing of the substrate 101, for instance by rotating the substrate 101 by, for instance 45 degrees, when a current flow direction along a <100> crystallographic axis may be required. In this case, the layer 103 may be appropriately provided on the substrate 101 so as to result in a highly efficient mechanical deformation along the newly selected current flow direction.

With reference to FIGS. 2a-2g, further illustrative embodiments will now be described in which circuit elements, such as transistors, may be formed on the basis of a piezoelectric material, which may be provided in the form of a substrate, such as the substrate 101 as previously explained with reference to FIGS. 1a-1d.

Figure 2A:
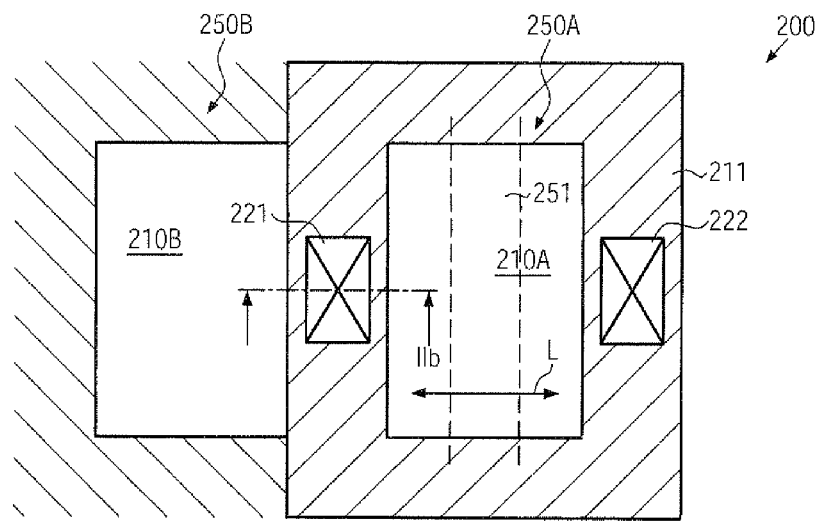
FIG. 2*a* schematically illustrates a top view of a semiconductor device in which one or more circuit elements may comprise a piezoelectric material mechanically coupled to a semiconductor region so as to induce strain therein upon application of an appropriate voltage to the piezoelectric material, according to illustrative embodiments.

FIG. 2a schematically illustrates a top view of a semiconductor device 200, which may comprise an appropriate substrate (not shown in FIG. 2a), which may include a piezoelectric material as explained above. The semiconductor device 200 may comprise one or more active regions 210A, 210B, which may be understood as semiconductor regions having or receiving an appropriate dopant profile therein in order to obtain at least one PN junction for controlling a current flow in the semiconductor material. The active regions 210A, 210B, which in one illustrative embodiment may represent a semiconductor material including a silicon species, possibly in combination with other components such as germanium and the like, may be laterally enclosed by an isolation structure 211 which, in one illustrative embodiment, may be provided in the form of a shallow trench isolation. The active regions 210A, 210B may represent a portion of circuit elements, such as transistors and the like, the performance of which may be adjusted on the basis of a strain created in the active regions 210A, 210B. For example, a first circuit element 250A may be formed on the basis of the active region 210A and a second circuit element 250B may be provided on the basis of the active region 210B. For example, the circuit element 250A may comprise or receive a gate electrode structure 251 when the device 250A represents a field effect transistor. In this case, a current flow direction in the active region 210A may be defined as a horizontal direction in FIG. 2a, also indicated as a length direction L. Thus, as previously explained, a strain component provided along the length direction L may result in an increase of hole mobility or electron mobility, depending on the type of strain or a specified crystallographic configuration.

The semiconductor device 200 may further comprise a first contact element 221 and a second contact element 222, which may extend to a certain depth so as to electrically connect to the piezoelectric material (not shown) so that an appropriate electric field may be established upon applying an appropriate voltage across the contact elements 221, 222. The elements 221, 222 may be comprised of any appropriate material composition, for instance in the form of a doped semiconductor material, a metal silicide material, tungsten, aluminum and the like. In the embodiment shown, the contact elements 221, 222 may be formed within the isolation structure 211, so that the piezoelectric material may be electrically accessed without connecting to the active region 210A, 210B. In this case, a magnitude and type of strain may be individually adjusted for the active region 210A, irrespective of any voltages applied to the active region 210A.

Figure 2B:
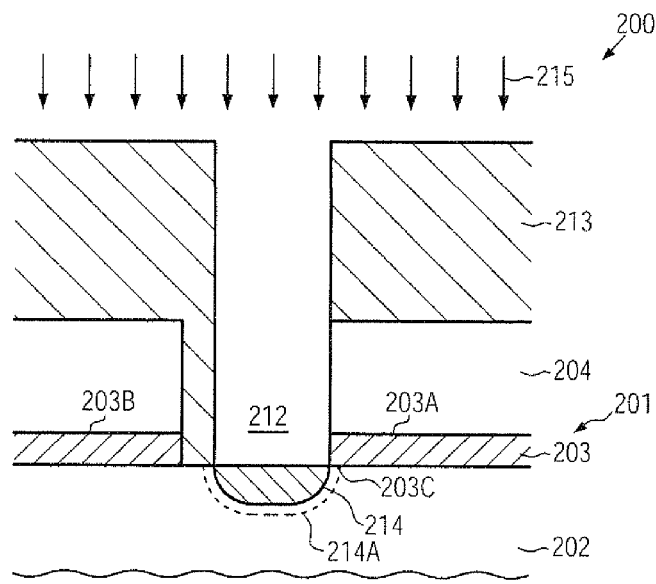
FIGS. 2*b*-2*c* schematically illustrate cross-sectional views of a portion of the semiconductor device in which a contact to the piezoelectric material may be obtained on the basis of an isolation structure, according to illustrative embodiments.

FIG. 2b schematically illustrates a cross-sectional view of the semiconductor device 200 during a manufacturing stage in which the contact elements 221, 222 (FIG. 2a) may be formed within the isolation structure 211 (FIG. 2a). As illustrated, the semiconductor device 200 may comprise a substrate 201 comprising a carrier material 202, a buried insulating layer comprising a piezoelectric material 203 and a semiconductor layer 204. The substrate 201 may have any configuration, as is also previously explained with reference to the substrate 101. Furthermore, the semiconductor layer 204 may comprise a trench 212 that extends to and, in the embodiment shown, through the piezoelectric material layer 203 so as to connect to the carrier material 202, which may comprise a crystalline semiconductor material. Moreover, an implantation mask 213 may be formed above the semiconductor layer 204 so as to expose a portion of the trench 212, for instance along a width direction, i.e., a direction perpendicular to the drawing plane of FIG. 2b and corresponding to a vertical direction in FIG. 2a, so as to connect to the entire width of the piezoelectric material 203. Furthermore, in the embodiment shown in FIG. 2b, the mask 213 may be asymmetric with respect to the trench length 212 if electrical contact is to be established to a portion 203A only, while not connecting to a portion 203B. It should be appreciated that any other contact regime may be established, depending on the desired controllability of strain conditions in the active regions 210A, 210B (FIG. 2a). The semiconductor device 200 as illustrated in FIG. 2b may be formed on the basis of the following processes. After providing the substrate 201, the trench 212 may be formed by using well-established patterning techniques involving sophisticated lithography and etch techniques. During the etching of the trench 212 into the semiconductor layer 204, the process may be controlled by using the piezoelectric material layer 203 as an etch stop or etch control material, for instance by detecting specific atomic species released into the etch ambient and the like. In other cases, as previously explained, additional insulating materials such as silicon dioxide, silicon nitride and the like, may be provided in combination with the piezoelectric material 203 so that established etch characteristics of these materials may be taken advantage of during the corresponding etch process. Thereafter, the implantation mask 213 may be provided, for instance in the form of a resist mask, and may be patterned in accordance with appropriate lithography techniques using a lithography mask including respective mask features for exposing the desired portion of the trench 212. Thereafter, an implantation process 215 may be performed to incorporate an implantation species 214 so as to provide a desired enhanced degree of conductivity. The corresponding dopant species in the implantation region 214 may reliably connect to the portion 203A after respective anneal processes, as indicated by the dashed line 214A, thereby forming a contact portion 203C for connecting to the piezoelectric material 203A. Thereafter, the further processing may be continued by removing the mask 213 and filling the trench 212 with any appropriate dielectric material, such as silicon dioxide and the like. Thereafter, the further processing may be continued by forming circuit elements, such as transistors, in and above the active regions 210A, 210B (FIG. 2a), wherein, at any appropriate manufacturing stage, the contacts 221, 222 (FIG. 2a) may be formed, for instance when forming contact elements to the active regions when forming substrate contacts and the like. For this purpose, any well-established process technique may be used.

Figure 2C:
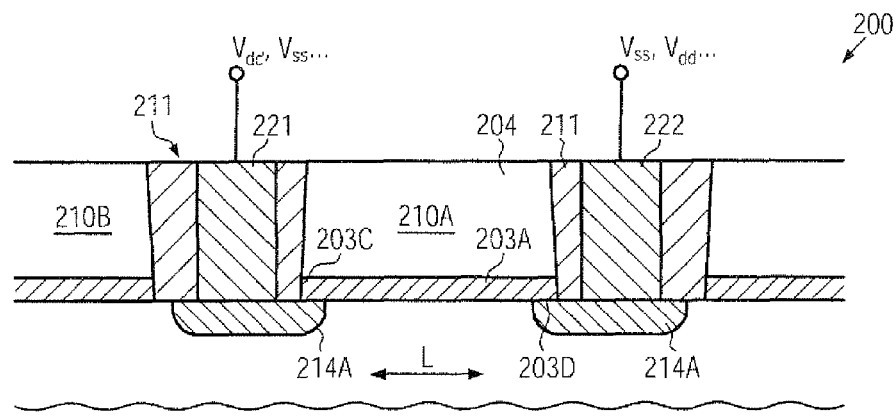

FIG. 2c schematically illustrates the semiconductor device 200 in a further advanced manufacturing stage. As illustrated, the contact elements 221, 222 may be formed in the isolation structure 211, wherein the contact element 221 may connect to contact portion 203C via the implantation region 214A. Similarly, the contact element 222 may connect to a second contact portion 203D of the piezoelectric material 203A via a corresponding implantation region 214A. Consequently, by connecting the contact elements 221, 222 to any appropriate voltage source, an electric field may be established within the material 203A, which substantially uniformly extends along the length direction within the material 203A and may thus result in a corresponding mechanical deformation, which in turn may result in a desired magnitude and type of strain within the active region 210A. Hence, the strain conditions in the active region 210A may be individually adjustable by the contact elements 221, 222 in order to appropriately adjust performance of any circuit element formed in and above the active region 210A.

Figure 2D:
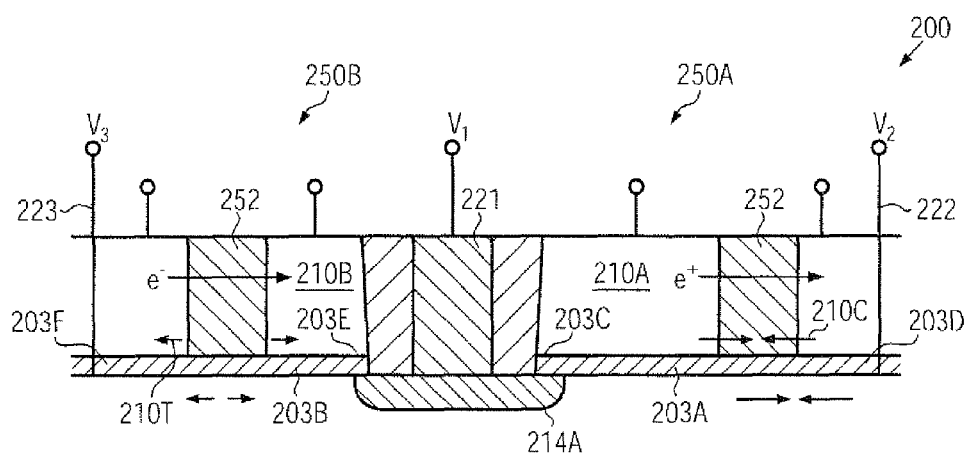
FIG. 2*d* schematically illustrates a cross-sectional view of the semiconductor device in which field strength and/or field orientation may be individually adjusted in two different piezoelectric regions, thereby enabling the adjustment of individual strain conditions in the corresponding active regions of the semiconductor device, according to illustrative embodiments.

FIG. 2d schematically illustrates a cross-sectional view of the semiconductor device 200 in which the strain conditions in the active regions 210B, 210A may be individually adjusted on the basis of the piezoelectric materials 203B, 203A by providing an appropriate contact structure, which may include the contact elements 221, 222 and at least one further contact element 223. In the embodiment shown, the contact element 221 may be used as a combined contact element so as to connect to both the piezoelectric material 203A and the material 203B via the contact portion 203C and a corresponding contact portion 203E. It should be appreciated, however, that, in other cases, separate contact elements may be provided to connect to the contact portion 203E, if desired. Similarly, the contact element 223, indicated in a schematic manner, may connect to a contact portion 203F so that the desired voltage may be applied across the contact elements 223, 221 to induce a certain type of strain 210T in the active region 210B, as previously explained. For example, the active region 210B may represent a part of the circuit element 250B in which the increase of the electron mobility in a specific zone 252, such as a channel region, may result in enhanced device performance. Thus, in this case, the voltage across the contact elements 223, 221 may be appropriately selected so as to obtain the strain component 210T in the form of a tensile strain component. Similarly, the active region 210A may represent a part of the circuit element 250A in which a specific zone 252 may result in enhanced performance upon creating a compressive strain component. Hence, in this case, the voltage across the contacts 221, 222 may be selected such that the electric field in the material 203A may result in a compressive strain component 210C.

Consequently, upon providing an appropriate contact regime for connecting to the piezoelectric materials 203A, 203B, appropriate strain conditions may be established, which may be adjusted by selecting the polarity and magnitude of the corresponding voltage. Thus, performance of the circuit elements 250A, 250B may be varied in the operation of the device 200, for instance for adapting performance of one or more of the elements 250A, 250B and the like. It should be appreciated that a plurality of active regions requiring the same type of strain conditions may be controlled on the basis of a common control voltage, while in other cases a plurality of circuit elements may be formed in and above a single active region, thereby establishing substantially identical strain conditions for each of these circuit elements.

Figure 2E:
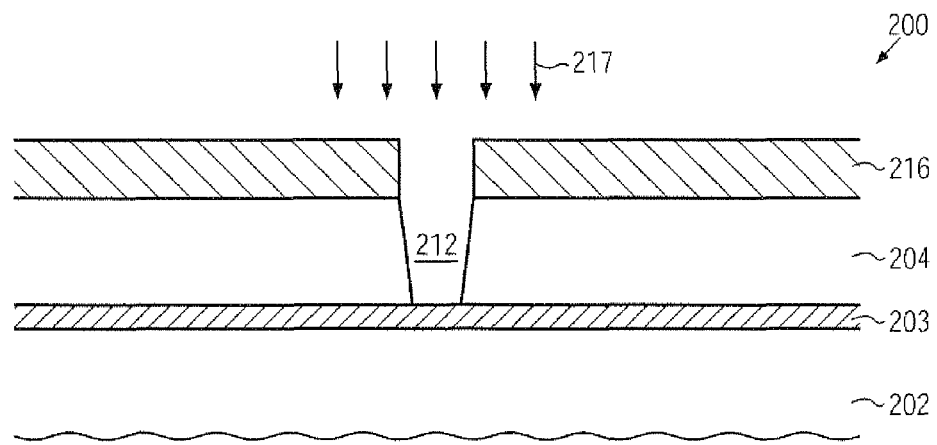
FIGS. 2*e*-2*g* schematically illustrate cross-sectional views of the semiconductor device during various manufacturing stages in forming field effect transistors of different conductivity types which may, at least temporarily, have a different type of strain in the corresponding channel regions, according to still further illustrative embodiments.
Figure 2F:
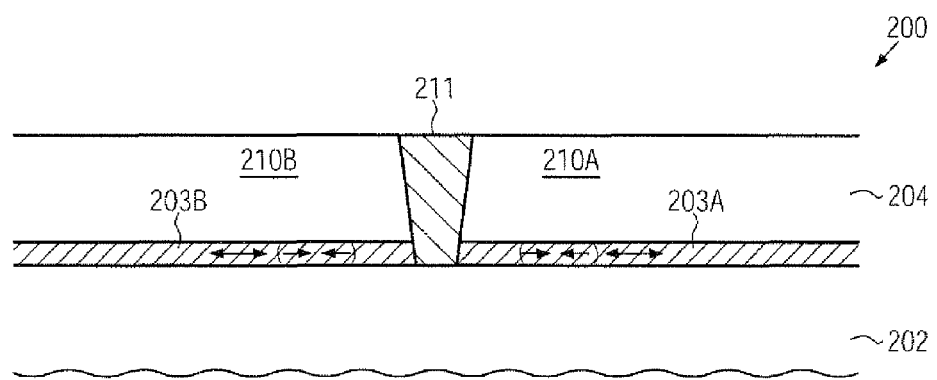
Figure 2G:
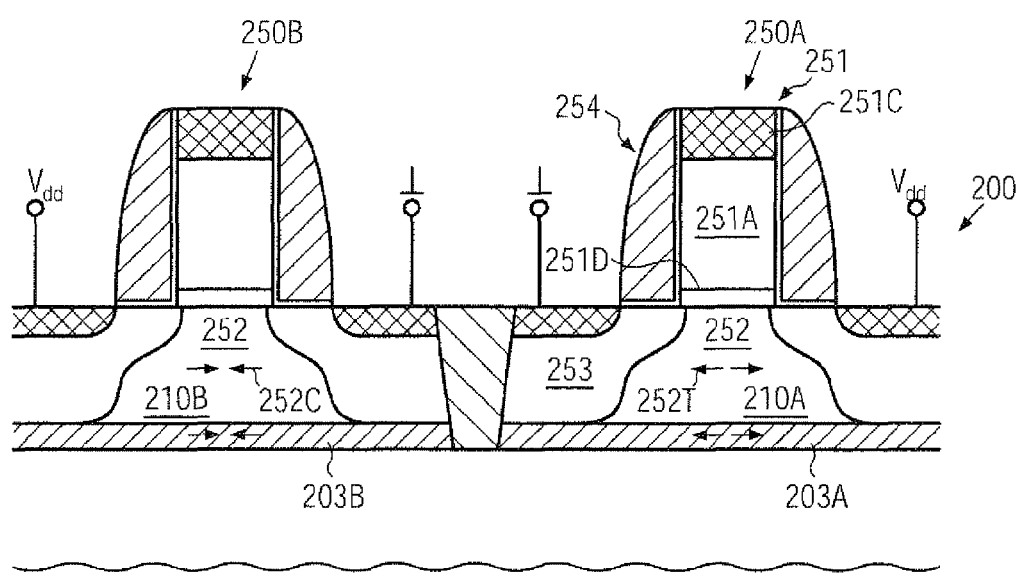

With reference to FIGS. 2e-2g, further illustrative embodiments will now be described in which the piezoelectric material may be contacted via the active region without requiring additional contact elements.

FIG. 2e schematically illustrates a cross-sectional view of the semiconductor device 200 when exposed to an etch ambient 217 in order to form the trench 212 on the basis of an etch mask 216. In the embodiment shown, this process 217 may be performed on the basis of well-established etch techniques, wherein appropriate endpoint detection techniques and the like may be used upon exposing the piezoelectric material 203. In other cases, as previously explained, the etch process 217 may be continued so as to etch through the layer 203 and a further insulating material may be provided, for instance a silicon dioxide material, which may act as an etch control layer.

FIG. 2f schematically illustrates the semiconductor device 200 in a further advanced manufacturing stage, i.e., after etching through the layer 203 and filling the trench 212 (FIG. 2e) with an appropriate dielectric material so as to provide the isolation structure 211. Thus, the isolation structure 211 may be formed on the basis of a high degree of compatibility with conventional process techniques, thereby providing the active regions 210A, 210B and the corresponding material layers 203A, 203B as "islands" that are separated by the structure 211.

FIG. 2g schematically illustrates the semiconductor device 200 in a further advanced manufacturing stage. In the embodiment shown, the circuit elements 250A, 250B formed on the basis of the active regions 210A, 210B may represent transistor elements, the performance of which may be adjusted on the basis of specific strain conditions, as described above. In one illustrative embodiment, the transistors 250A, 250B may represent field effect transistors comprising a gate electrode structure 251, which may include a gate insulation layer 251D that separates a gate electrode material 251A from the channel region 252. Furthermore, the gate electrode structure 251 may comprise additional components, such as a metal silicide 251C, spacer structure 254 and the like, if required. It should be appreciated that in other embodiments the gate electrode structure 251 may comprise a high-k dielectric material, i.e., the dielectric material having a dielectric constant of approximately 10.0 and higher, which may be included in the gate insulation layer 251D. Similarly, the electrode material 251A may comprise a metal-containing material that may be in contact with the gate insulation layer 251D. Moreover, the transistors 250A, 250B may comprise drain and source regions 253, which may be separated by the channel region 252. In some illustrative embodiments, the transistor 250A may represent a transistor requiring a tensile strain component 252T, while the transistor 250B may represent a transistor requiring a compressive strain component 252C. For example, the transistors 250A, 250B may represent an N-channel transistor and a P-channel transistor, respectively. It should be appreciated that in other cases the transistors 250A, 250B may require the same type of strain, however, with a different magnitude and the like. As illustrated, the drain and source regions 253 may extend down to the corresponding piezoelectric materials 203A, 203B, thereby providing an appropriate contact regime in order to generate an electric field, at least temporarily, within the materials 203A, 203B according to the corresponding supply voltages supplied to drain and source regions 253. For example, in the transistor 250A, one of the drain and source regions 253 may receive the supply voltage $V_{dd}$, while the other one of the drain and source regions 253 may receive ground potential at a specific operational state. In this case, the strain component 252T may be established within the channel region 252 of the transistor 250A, which may result in an enhanced performance, at least as long as the corresponding voltage may drop across the drain and source regions 253. Similarly, the transistor 250B in the form of a P-channel transistor may receive the supply voltage $V_{dd}$ and the ground potential, thereby inducing the compressive strain component 252C, since the electric field in the material 203B is of opposite direction compared to the electric field in the material 203A with respect to the supply voltages as illustrated in FIG. 2g. Thus, in this case, performance of the transistor 250B may be enhanced, at least as long as a corresponding voltage drop may exist across the drain and source regions 253. For example, in the transistor 250A, a positive voltage applied to the gate electrode structure 251 may thus result in the creation of a conductive channel, which may have an enhanced conductivity due to the presence of the tensile strain component 252T, as long as a sufficient voltage drop exists across the drain and source regions 253. Consequently, in this case, the transistor 250A may have an increased drive current capability so as to achieve an increased switching speed. Similarly, the transistor 250B may also have superior performance, at least during a corresponding switching event.

The transistors 250A, 250B may be formed on the basis of any well-established manufacturing technique, wherein, however, contrary to conventional strategies, different strain conditions may be established by using a single material in the form of the layers 203A, 203B without requiring complex separate process strategies for the transistors 250A, 250B. It should be appreciated, however, that, if required, other strain-inducing mechanisms may be implemented in one or both of the transistors 250A, 250B. For example, a strain-inducing semiconductor alloy may be embedded into the active regions 210A, 210B, for instance by forming cavities therein and depositing an appropriate semiconductor alloy, as is previously described. Similarly, strain-inducing dielectric materials may be formed above one or both of the transistors 250A, 250B in accordance with well-established stress engineering techniques. In this manner, respective "static" or "permanent" strain conditions may be established in one or both of the transistors 250A, 250B, while the mechanism based on the material layer 203A, 203B may provide an efficient modulation of the static strain conditions.

As a result, the present disclosure provides semiconductor devices, substrates for forming the same and methods of operating the semiconductor device, in which a piezoelectric material may be used for adjusting the strain conditions within circuit elements, such as field effect transistors. To this end, an appropriate piezoelectric material may be provided in close proximity to the active semiconductor region, such as a channel region, and upon application of an appropriate voltage, a strain component may be established, which may be accomplished in a controllable manner or which may depend on the operational status of a circuit element formed in and above the semiconductor region under consideration. Consequently, different types of strain may be implemented into circuit elements, such as field effect transistors, on the basis of a single manufacturing regime, thereby significantly reducing the complexity of the overall manufacturing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of generating strain in a semiconductor device, the method comprising:
    providing a first piezoelectric region above a substrate region of the semiconductor device and below a first active region of a first semiconductor circuit element so as to be mechanically coupled to said first active region of said first semiconductor circuit element;
    providing a second piezoelectric region above said substrate region and below a second active region of a second semiconductor circuit element so as to be mechanically coupled to said second active region of said second semiconductor circuit element, wherein said first piezoelectric region is electrically isolated from said second piezoelectric region by an isolation structure;
    connecting a supply voltage to a first end of said first piezoelectric region and to a first end of said second piezoelectric region;
    connecting ground potential to a second end of said first piezoelectric region and to a second end of said second piezoelectric region;
    activating said supply voltage to generate a first electric field in said first piezoelectric region so as to be aligned with a first current flow direction in said first active region, said first electric field inducing a tensile strain in said first active region along said first current flow direction;
    activating said supply voltage to generate a second electric field in said second piezoelectric region so as to be aligned with a second current flow direction in said second active region, said second electric field inducing a compressive strain in said second active region, wherein said first electric field and said second electric field have opposite directions; and
    establishing a first current flow in said first active region and a second current flow in said second active region.

2. The method of claim 1, wherein said first active region comprises a channel region of a field effect transistor and wherein said first electric field in said first piezoelectric region is generated so as to control a drive current through said channel region.

3. The method of claim 1, wherein said second active region comprises a channel region of a field effect transistor and wherein said second electric field in said second piezoelectric region is generated so as to control a drive current through said channel region.

4. The method of claim 1, wherein said first active region comprises a channel region of an N-channel transistor and said second active region comprises a channel region of a P-channel transistor.

5. The method of claim 4, wherein said first and second electric fields are generated in an alternating manner.

6. The method of claim 4, further comprising controlling said first electric field in said first piezoelectric region and said second electric field in said second piezoelectric region so as to individually adjust a first drive current capability of said N-channel transistor and a second drive current capability of said P-channel transistor, respectively.

7. The method of claim 1, wherein providing said first and said second piezoelectric regions comprises forming a piezoelectric material with a thickness of approximately 1 μm or less.

8. The method of claim 1, wherein providing said first and said second piezoelectric regions comprises forming a piezoelectric material above a buried insulation layer that is formed below said first and second active regions, said piezoelectric material having a thickness of approximately 1 μm or less.

9. The method of claim 1, further comprising providing at least one PN junction in at least one of said first and second active regions.

10. The method of claim 9, wherein at least one of said first and second active regions comprises a channel region of a field effect transistor.

11. The method of claim 1, wherein connecting said supply voltage to said first end of said first piezoelectric region comprises connecting said supply voltage to a drain region of a first transistor element formed in and above said first active region and wherein connecting said ground potential to said second end of said first piezoelectric region comprises connecting said ground potential to a source region of said first transistor element.

12. The method of claim 11, wherein connecting said supply voltage to said first end of said second piezoelectric region comprises connecting said supply voltage to a source region of a second transistor element formed in and above said second active region and wherein connecting said ground potential to said second end of said second piezoelectric region comprises connecting said ground potential to a drain region of said second transistor element.

13. A method of generating strain in a semiconductor device, the method comprising:
providing a first piezoelectric region between a substrate region of said semiconductor device and a first active region of said semiconductor device, wherein said first piezoelectric region is mechanically coupled to said first active region;
providing a second piezoelectric region between said substrate region and a second active region of said semiconductor device, wherein said second piezoelectric region is mechanically coupled to said second active region, and wherein said first active region and said first piezoelectric region are electrically isolated from said second active region and said second piezoelectric region, respectively, by an isolation structure;
connecting a voltage source to a first end of said first piezoelectric region and to a first end of said second piezoelectric region;
connecting ground potential to a second end of said first piezoelectric region and to a second end of said second piezoelectric region;
operating said voltage source to generate a first electric field having a first field direction in said first piezoelectric region, said first electric field inducing a first type of strain in said first active region; and
operating said voltage source to generate a second electric field having a second field direction in said second piezoelectric region, said second electric field inducing a second type of strain in said second active region, wherein said first field direction is opposite of said second field direction.

14. A method, comprising:
providing a first piezoelectric material region above a substrate region of a semiconductor device and below a first active region of said semiconductor device, wherein said first piezoelectric material region is mechanically coupled to said first active region;
providing a second piezoelectric material region above said substrate region of said semiconductor device and below a second active region of said semiconductor device, wherein said second piezoelectric material region is mechanically coupled to said second active region, and wherein said first piezoelectric material region is electrically isolated from said second piezoelectric material region by an isolation structure;
connecting a voltage source to a source region of a first transistor element formed in and above said first active region and to a drain region of a second transistor element formed in and above said second active region;
connecting ground potential to a drain region of said first transistor element and to a source region of said second transistor element;
operating said voltage source to apply a voltage to said source region of said first transistor element and to said drain region of said second transistor element; and
using said applied voltage to generate a first electric field in said first piezoelectric material region and a second electric field in said second piezoelectric material region, said first and second electric fields having opposite field directions.

15. The method of claim 14, wherein generating said first and second electric fields comprises inducing a strain in a channel region of said respective first and second transistor elements.

16. The method of claim 14, further comprising adjusting a drive current in a channel region of said respective first and second transistor elements by controlling said applied voltage.

17. The method of claim 14, wherein said source region of said first transistor element and said drain region of said second transistor element extend down to and contact said first and second piezoelectric material regions, respectively.

* * * * *